United States Patent
Wang et al.

(10) Patent No.: US 9,214,413 B2
(45) Date of Patent: Dec. 15, 2015

(54) SEMICONDUCTOR DIE PACKAGE WITH PRE-MOLDED DIE

(71) Applicants: Zhijie Wang, Tianjin (CN); Zhigang Bai, Tianjin (CN); Aipeng Shu, Tianjin (CN); Yanbo Xu, Tianjin (CN); Huchang Zhang, Tianjin (CN); Fei Zong, Tianjin (CN)

(72) Inventors: Zhijie Wang, Tianjin (CN); Zhigang Bai, Tianjin (CN); Aipeng Shu, Tianjin (CN); Yanbo Xu, Tianjin (CN); Huchang Zhang, Tianjin (CN); Fei Zong, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/551,069

(22) Filed: Nov. 23, 2014

(65) Prior Publication Data

US 2015/0243586 A1    Aug. 27, 2015

(30) Foreign Application Priority Data

Feb. 25, 2014    (CN) .......................... 2014 1 0137252

(51) Int. Cl.
| | | |
|---|---|---|
| *H01L 21/50* | (2006.01) | |
| *H01L 23/495* | (2006.01) | |
| *H01L 21/56* | (2006.01) | |
| *H01L 23/373* | (2006.01) | |
| *H01L 23/42* | (2006.01) | |

(52) U.S. Cl.
CPC .......... *H01L 23/49503* (2013.01); *H01L 21/56* (2013.01); *H01L 23/3737* (2013.01); *H01L 23/42* (2013.01); *H01L 23/49568* (2013.01); H01L 23/49541 (2013.01); H01L 2224/48091 (2013.01); H01L 2224/48247 (2013.01); H01L 2224/73265 (2013.01)

(58) Field of Classification Search
CPC .............. H01L 23/49503; H01L 21/56; H01L 23/3737; H01L 23/42; H01L 23/49568
USPC .......................................................... 438/122
See application file for complete search history.

(56) References Cited

U.S. PATENT DOCUMENTS

| | | | |
|---|---|---|---|
| 5,519,576 A | 5/1996 | Moore | |
| 5,594,234 A | 1/1997 | Carter | |
| 6,835,592 B2 | 12/2004 | Hall | |
| 7,012,324 B2 | 3/2006 | Li | |
| 7,833,840 B2 | 11/2010 | Ahn | |
| 7,977,774 B2* | 7/2011 | Choi | H01L 23/49503 257/666 |
| 8,188,583 B2* | 5/2012 | Arita | H01L 23/3107 257/669 |
| 8,304,869 B2* | 11/2012 | Camacho | H01L 23/49575 257/676 |
| 8,314,484 B2* | 11/2012 | Kajiwara | H01L 21/56 257/705 |
| 8,389,338 B2 | 3/2013 | Liu | |
| 8,409,918 B2 | 4/2013 | Yang | |
| 8,853,840 B2* | 10/2014 | Au | H01L 23/49555 257/676 |
| 9,006,871 B2* | 4/2015 | Fujisawa | H01L 23/3107 257/663 |
| 2015/0160087 A1* | 6/2015 | Foong | G01L 9/0098 73/146.2 |

* cited by examiner

*Primary Examiner* — Luan C Thai
(74) *Attorney, Agent, or Firm* — Charles Bergere

(57) ABSTRACT

A semiconductor die is packaged by providing a die assembly that includes a semiconductor die with an active surface and an opposite mounting surface with an attached thermally conductive substrate. The die assembly is mounted on a first surface of a lead frame die flag so that the thermally conductive substrate is sandwiched between the die flag and the semiconductor die. Bonding pads of the die are electrically connected with bond wires to lead frame lead fingers. A mold compound then encapsulates the semiconductor die, bond wires, and thermally conductive substrate. A second surface of the die flag is exposed through the mold compound.

17 Claims, 6 Drawing Sheets

SEMICONDUCTOR DIE PACKAGE WITH PRE-MOLDED DIE

BACKGROUND OF THE INVENTION

The present invention relates generally to semiconductor die packages and, more particularly, to an exposed die, lead frame based package.

Semiconductor die packaging provides for suitable external electrical connections and protection of a semiconductor die against mechanical and environmental stresses. Continued progress in reduction of the size of the semiconductor dies and increased functionality and complexity of the circuits integrated in the dies require size reduction of the packaging.

Semiconductor dice are commonly packaged for surface mounting by encapsulating one or more semiconductor dice with a mold compound. In a wire bonded semiconductor die package, the semiconductor die may be mounted on a substrate with electrodes of the semiconductor die on the active face of the die opposite from the substrate. Wires are then bonded to the electrodes and to the exposed electrical contacts of the package to provide the internal connections. The substrate may be an electrically conductive lead frame, whose frame members are cut off and discarded during production after applying molding compound to encapsulate the semiconductor die, the internal connections and the exposed electrical contacts from the lead frame.

One type of semiconductor die package is an exposed flag (or paddle) lead frame package in which the flag is exposed to provide for heat dissipation. During encapsulation, the lead frame and mounted semiconductor die are heated to a molding temperature. The mold compound, in a heated molten form, is then molded to encapsulate the die and part of the lead frame. However, the mold compound does not cover an outwardly facing surface of the die flag. Hence, the die flag is exposed through the mold compound to provide improved thermal dissipation of heat generated by the die during operation.

On problem with the above exposed flag packages is that the die flag and the die each have a significantly lower Coefficient of Thermal Expansion (CTE) than that of the mold compound. As a result, during post mold curing of the mold compound the upper region of the package receives a compressive stress and the bottom region of the package receives a tensile stress. These stresses can cause one or more fractures in the die, located in the tensile stress bottom region, thereby compromising the packaged device.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
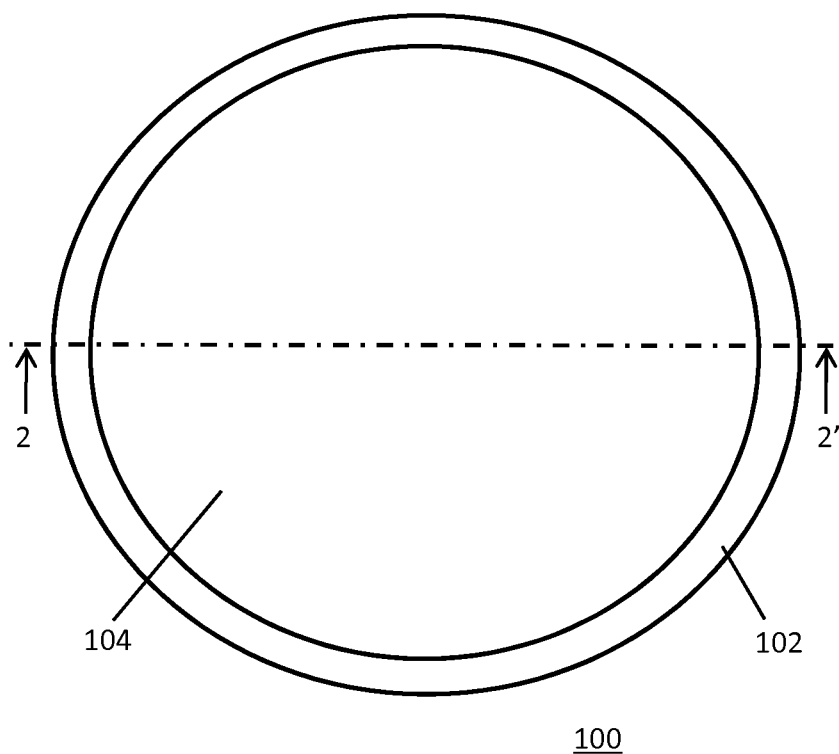
FIG. 1 is a plan view of a molded wafer structure in accordance with an embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a method of assembling a semiconductor die package. The method comprises providing a die assembly that includes a semiconductor die with an active surface and an opposite mounting surface, the mounting surface having a thermally conductive substrate attached thereto. A lead frame is provided that includes a surrounding frame and a flag is supported by the surrounding frame. The die flag has a first surface, and an opposite second surface. Lead fingers extend inwardly from the surrounding frame towards the die flag. The method includes mounting the die assembly on the first surface of the die flag so that the thermally conductive substrate is sandwiched between the die flag and the semiconductor die. The method also includes electrically connecting bonding pads of die to lead fingers of the lead frame with bond wires. Also performed is a process of encapsulating at least the semiconductor die, bond wires and thermally conductive substrate with a mold compound, where the second surface of the die flag is exposed through the mold compound.

In another embodiment, the present invention provides a semiconductor die package comprising a thermally conductive die flag having a first surface and an opposite second surface. There are lead fingers extending outwardly from the die flag. A die assembly mounted on the first surface of the die flag, the die assembly includes a semiconductor die with an active surface and an opposite mounting surface. The mounting surface has a thermally conductive substrate attached thereto and sandwiched between the die flag and the semiconductor die. Bond wires electrically connect electrodes of the die to the lead fingers. A mold compound encapsulates the semiconductor die, bond wires and thermally conductive substrate.

Referring now to FIG. 1, a top plan view of a molded wafer structure 100 in accordance with an embodiment of the present invention is shown. The molded wafer structure 100 includes a thermally conductive compound 102 molded to a silicon wafer (hidden in this illustration) that has an active surface protected by an attached protective film 104.

Figure 2:
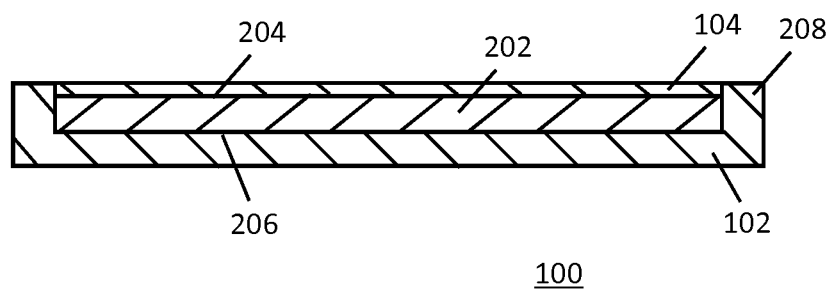
FIG. 2 is a cross-sectional side view, through 2-2', of the structure of FIG. 1.

Referring to FIG. 2, a cross-sectional side view, through 2-2', of the molded wafer structure 100 is shown. FIG. 2 shows the silicon wafer 202 with an active surface 204 that is protected by the protective film 104, and the thermally conductive compound 102 is molded to an opposite mounting surface 206 of the wafer 202. In this specific embodiment, the thermally conductive compound 102 has an annulus region 208 and in other embodiments this annulus region need not be present. Also, in other embodiments the thermally conductive compound 102 can be bonded, instead of molded, to the mounting surface 206 of the wafer 202.

Figure 3:
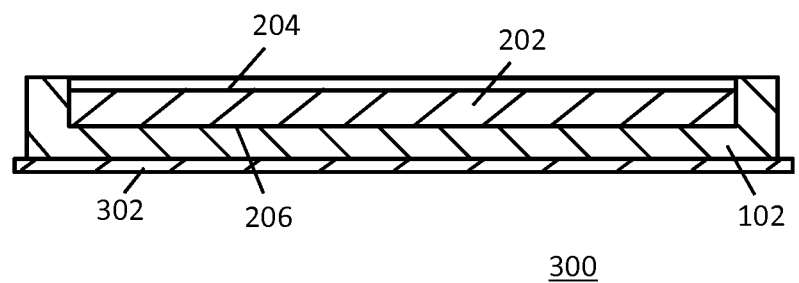
FIG. 3 is a cross-sectional side view of a processed wafer structure, which is a processed version of the molded wafer structure of FIG. 1, in accordance with an embodiment of the present invention.

Referring to FIG. 3, a cross-sectional side view of a processed wafer structure 300, which is a processed version of the molded wafer structure 100, is shown. The processed wafer structure 300 has had the protective film 104 removed, thereby exposing the active surface 204, and a supporting film 302 is attached to a base surface of the thermally conductive compound 102.

Figure 4:
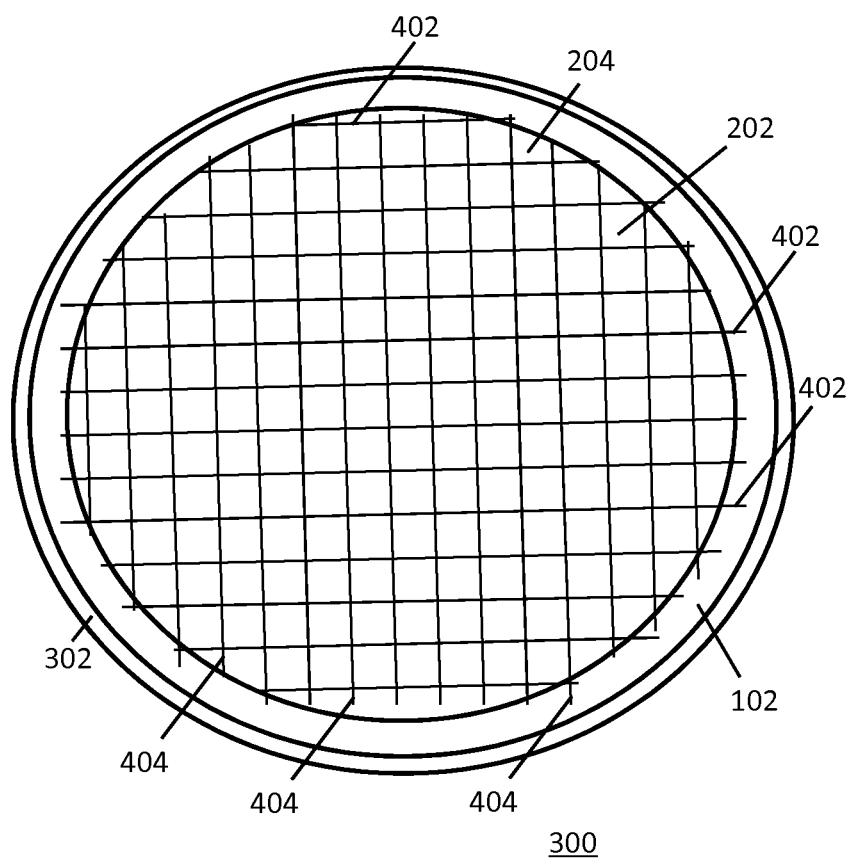
FIG. 4 is a plan view of the processed wafer structure of FIG. 3.

Referring to FIG. 4, a plan view of the processed wafer structure 300 is shown. In this illustration, dicing lines 402, 404 are shown and illustrate how the processed wafer structure 300 is cut (sawn) into individual die assemblies as will be apparent to a person skilled in the art.

Figure 5:
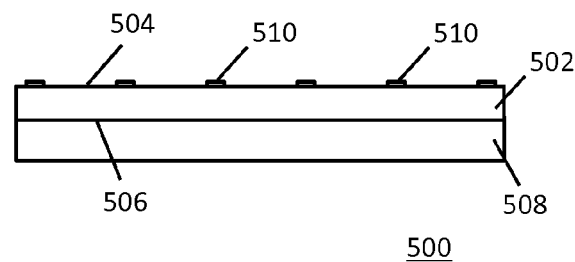
FIG. 5 is a side view of a single die assembly that has been cut from the processed wafer structure of FIG. 3.

Referring to FIG. 5, a side view of a single die assembly 500 that has been cut (diced) from the processed wafer structure 300 along selected dicing lines 402, 404 is shown. The die assembly 500 includes a semiconductor die 502, cut (diced) from the processed wafer structure 300, with an active surface 504 and an opposite mounting surface 506. Also, the mounting surface 506 has an attached thermally conductive substrate 508, which is a region of the diced thermally conductive compound 102. Typically, the thermally conductive substrate 508 is formed from thermally conductive epoxy molding compound which includes high thermally conductive ceramic fillers. Such fillers are Aluminum Nitride and Alumina, which have a high thermal conductivity.

On or protruding from the active surface 504 are electrodes 510 of the die 502 that are connected to nodes of a circuit in the die 502. During dicing of the assembly 500, the supporting film 302 provided a substrate that retained each diced die assembly 500 in situ. After completion of the dicing process, each die assembly 500 is removed from the supporting film 302 by a pick and place machine as will be apparent to a person skilled in the art.

Figure 6:
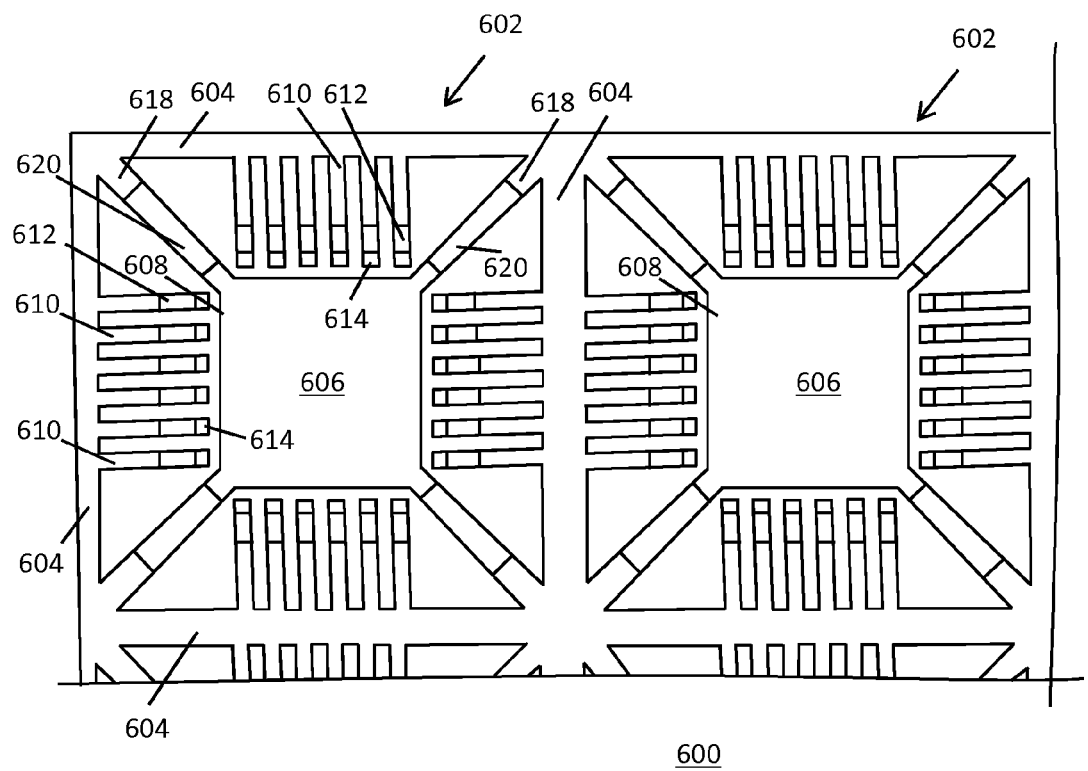
FIG. 6 is a partial plan view of a lead frame sheet.

FIG. 6 is a partial plan view of a lead frame sheet 600. The lead frame sheet 600 is typically formed from metal such as copper and thus is both thermally and electrically conducive. The sheet 600 has a plurality of lead frames 602 in an array and the lead frames 602 are typically formed by punching or cutting out regions of the sheet 600. Each of the lead frames 602 has an outer surrounding frame 604 that surrounds a centrally located die flag 606 supported by the surrounding frame 604. The die flag 606 has a first surface 608 and there are lead fingers 610 that extend inwardly from the surrounding frame 604 towards the die flag 606.

The lead fingers 610 have and angled section 612 relative to the surrounding frame 604 such that free ends 614 of the lead fingers 610 are down-set from the surrounding frame 604.

Also, there are tie bars 618 that extend inwardly from the surrounding frame 604 and support the die flag 606. The tie bars 618 each have an angled section 620 that is angled to form a down-set relationship between the die flag 606 and surrounding frame 604.

Figure 7:
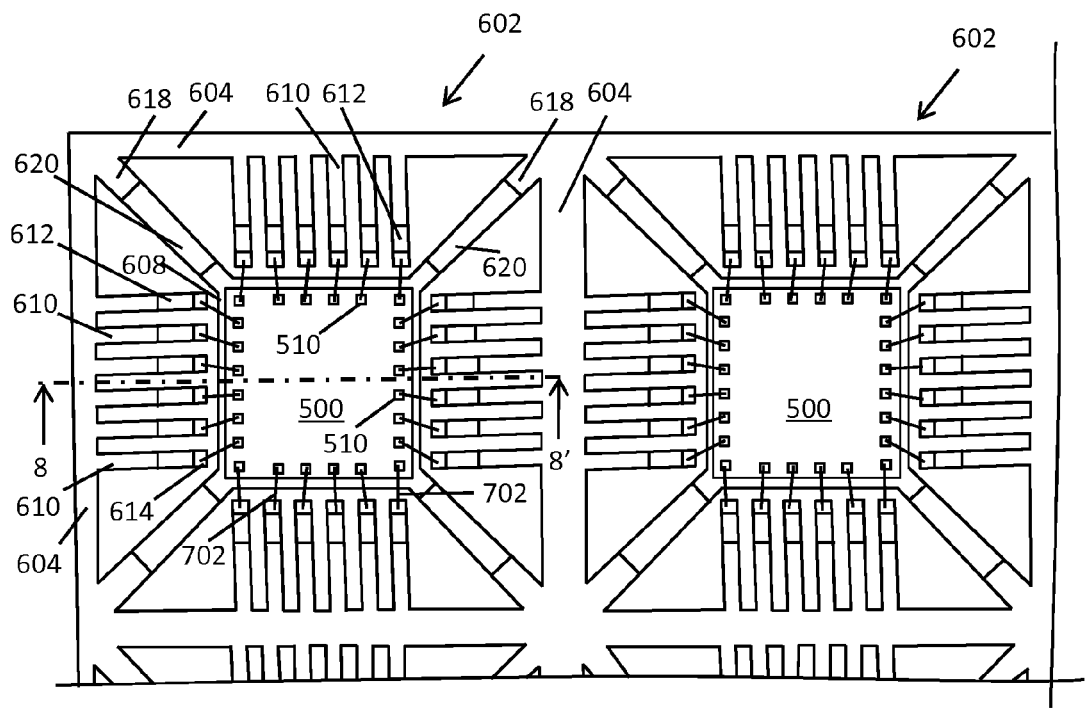
FIG. 7 is a partial plan view of a populated lead frame sheet, formed from the lead frame sheet of FIG. 6, in accordance with a preferred embodiment of the present invention.

FIG. 7 is illustrated a partial plan view of a populated lead frame sheet 700, formed from the lead frame sheet 600, in accordance with a preferred embodiment of the present invention. Mounted to the first surface 608 of each die flag 606 is one of the single die assemblies 500 that has been cut from the processed wafer structure 300. The electrodes 510 of the die 502 are selectively electrically connected, by bond wires 702, to the free ends 614 of the lead fingers 610.

Figure 8:
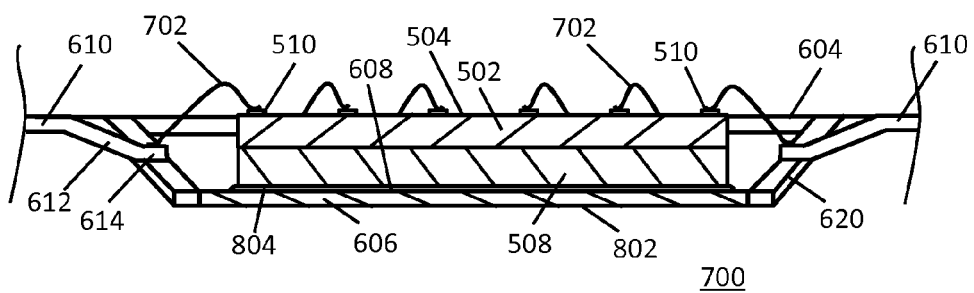
FIG. 8 is a partial cross-sectional side view, through 8-8', of the populated lead frame sheet of FIG. 7.

FIG. 8 is a partial cross-sectional side view, through 8-8', of the populated lead frame sheet 700. This view clearly illustrates the down-set relationship of both the die flag 606 and the free ends 614 of the lead fingers 610 relative to the surrounding frame 604. Furthermore, the die flag 606 has a lowermost surface which is a second surface 802 that is opposite the first surface 608. As shown, the die assembly 500 is mounted on the first surface 608 of the die flag 606 so that the thermally conductive substrate 508 is sandwiched between the die flag 606 and the semiconductor die 502. As will be apparent to a person skilled in the art, the assembly 500 is mounted on the first surface 608 with a thermal conductive epoxy 804 whose thickness is relatively insignificant.

Figure 9:
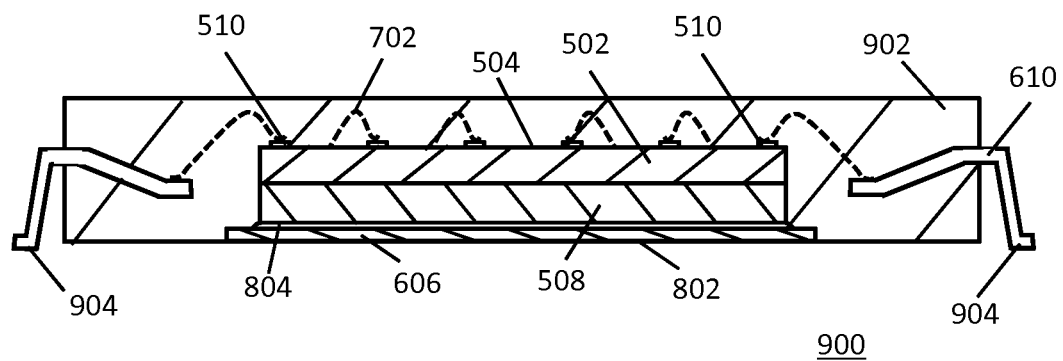
FIG. 9 is a cross-sectional side view of a semiconductor die package, formed from one of the lead frames of the populated lead frame sheet of FIG. 7, in accordance with a preferred embodiment of the present invention.

FIG. 9 is a cross-sectional side view of a semiconductor die package 900 formed from one of the lead frames 602 of the populated lead frame sheet 700, in accordance with a preferred embodiment of the present invention. The semiconductor die package 900 has a mold compound 902 encapsulating the semiconductor die 502, bond wires 702 and thermally conductive substrate 508. However, the second surface 802 of the die flag 606 is exposed through the mold compound 902 and therefore provides a heat dissipating surface for the package 900. As will be apparent to a person skilled in the art, after application of the mold compound 902 the package 900 has been singulated from the populated lead frame sheet 700. The lead fingers 610 are then trimmed and formed to provide mounting feet 904.

In summary, the completed semiconductor die package 900 includes the thermally conductive die flag 606 in which the lead fingers 610 are extending outwardly from the mount 606. Also, in this specific embodiment the thermally conductive substrate 508 is a compound based material that is molded to the semiconductor die as will be apparent to a person skilled in the art.

Figure 10:
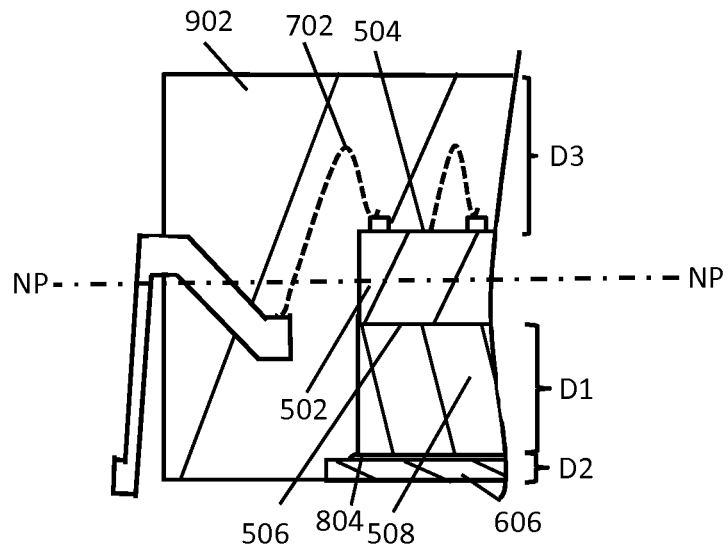
FIG. 10 is a magnified partial view of the semiconductor die package of FIG. 9.

FIG. 10 is an enlarged partial view of the semiconductor die package 900. As shown, the semiconductor die 502 is located in a mechanical stress neutral plane NP of the package 900. In one embodiment, this mechanical stress neutral plane NP is both parallel to and equidistant from the active surface 504 and the opposite mounting surface 506 of the semiconductor die 502. In this specific embodiment as illustrated the thermally conductive substrate 508 has a thickness dimension D1 and a region of the mold compound 902 directly aligned above the active surface 504 of the semiconductor die 502 has a thickness dimension D3. Typically, the thickness dimension D1 of the thermally conductive substrate 508 and thickness dimension D3 of the directly aligned mold compound 902 are within 5% of each other. This normally ensures that the mechanical stress neutral plane NP is located between, and ideally equidistant, from the active surface 504 and the opposite mounting surface 506.

Typically, the positioning of the mechanical stress neutral plane NP between the active surface 504 and the opposite mounting surface 506 requires thermally conductive substrate 508 and mold compound 902 to have CTEs within 10% of each other. However, the CTEs may need to be within 5% of each other to position the stress neutral plane NP equidistant from the active surface 504 and the opposite mounting surface 506.

Further to the above, to position the mechanical stress neutral plane NP at, or near, equidistance from the active surface 504 and the opposite mounting surface 506, it is useful for the package 900 to comply with the following requirements:

$$(D1 \times CTE1) + (D2 \times CTE2) = (D3 \times CTE3);$$

where CTE1 is the Coefficient of Thermal Expansion of the thermally conductive substrate 508 with a thickness dimension D1, CTE2 is the Coefficient of Thermal Expansion of the die flag 606 with a thickness dimension D2, and CTE3 is the Coefficient of Thermal Expansion of the mold compound 902 directly aligned above the active surface 504 with a thickness dimension D3.

In other words, the thickness dimension D1 of the thermally conductive substrate 508 multiplied by a Coefficient of Thermal Expansion (CTE1) thereof, plus a thickness dimension D2 of the die flag 606 multiplied by a Coefficient of Thermal Expansion (CTE2) thereof is equal to a thickness dimension D3 of a region of the mold compound 902 directly aligned above the active surface multiplied by a Coefficient of Thermal Expansion (CTE3) thereof. However, in some embodiments this requirement may be relaxed slightly so that the thickness dimension D1 of the thermally conductive substrate 508 multiplied by the CTE1 thereof, plus a thickness dimension D2 of the die flag 606 multiplied by the CTE2 thereof is within 5% of a thickness dimension D3 of a region of the mold compound 902 directly aligned above the active surface multiplied by the CTE3 thereof.

It should be noted that the above requirements are not always appropriate. Hence, digital modelling using Fine element analysis can be used to determine the appropriate dimension of D1. This is achieved by taking into account factors including package constraint thickness, die amount thickness D2 and material properties (such as CTE modulus and Poisson ratios) of the mold compound 902, thermally conductive substrate 508, semiconductor die 502 and the die amount 606. By accounting for these factors the stress neutral plane NP can be positioned equidistant from the active surface 504 and the opposite mounting surface 506 of the die 502.

Figure 11:
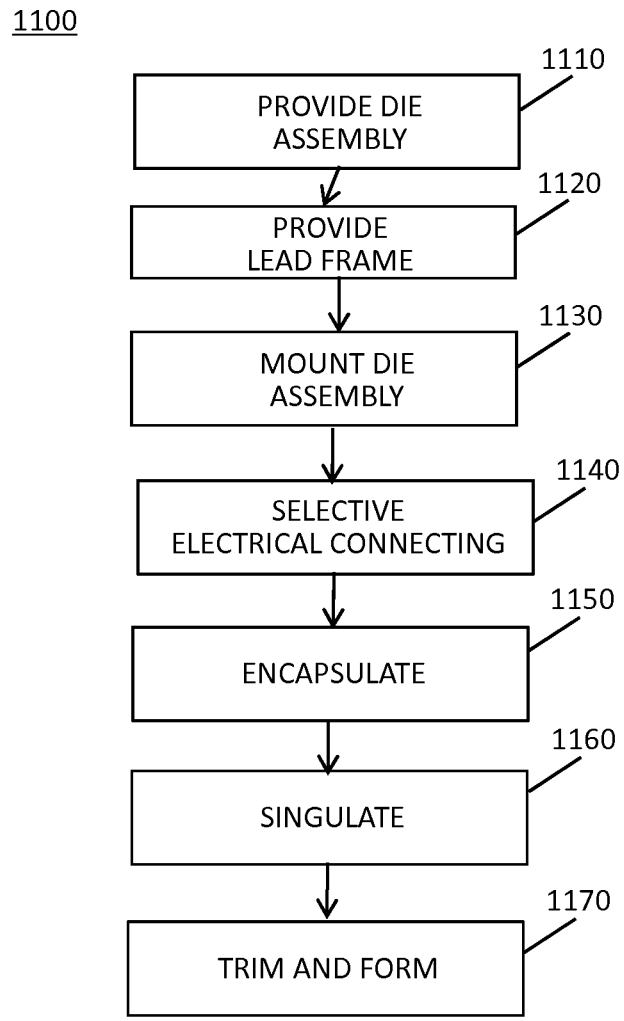
FIG. 11 is a flow chart illustrating a method of assembling a semiconductor die package in accordance with an embodiment of the present invention.

Referring to FIG. 11, a flow chart of a method 1100 of assembling a semiconductor die package in accordance with an embodiment of the present invention is shown. By way of example, the method 1100 will be described with reference to the embodiments illustrated in FIGS. 1 to 10. However, it is to be understood that the method 1100 is not limited to the embodiments of FIGS. 1 to 10.

The method 1100, at a providing block 1110, provides the die assembly 500 in which the thermally conductive substrate 508 can be either molded or bonded to the mounting surface 506 semiconductor die 502. At a further providing block 1120 the lead frame 602 of the lead frame sheet 600 is provided. At a mounting block 1130, the die assembly 500 is mounted on the first surface of the die flag 606 of the lead frame 602 and forms part of the populated lead frame sheet 700. Once mounted, the thermally conductive substrate 508 is sandwiched between the die flag 602 and the semiconductor die 502.

At a block 1140 the method 1100 provides for selectively electrically connecting the electrodes 510 of the die 502 to the free ends 614 of the lead fingers 610. This selectively electrically connecting is provided by the bond wires 702. The semiconductor die 502, bond wires 702 and thermally conductive substrate 508 are then encapsulated with the mold compound 902 at an encapsulating block 1150. However, the second surface 802 of the die flag 606 is exposed through the mold compound 902 as this exposed surface is required for heat dissipation when the formed package is in use.

The lead frame 602 is then singulated from the populated lead frame sheet 700 at a singulating block 1160. This singulation is achieved by severing the lead fingers 610 and tie bars 618 from the surrounding frame 604. Finally, trimming (if required) and forming is performed on the severed lead fingers 610 to provide the mounting feet 904 at block of 1170.

Advantageously, the present invention provides for semiconductor die 502 of the package 900 to be located in a mechanical stress neutral plane NP. Accordingly, the present invention at least alleviates thermo-mechanical stress applied to a semiconductor die at post mold cooling.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of assembling a semiconductor die package, the method comprising:
    providing a die assembly that includes a semiconductor die with an active surface and an opposite mounting surface, wherein the mounting surface has a thermally conductive substrate attached thereto;
    providing a lead frame that includes a surrounding frame, a die flag supported by the surrounding frame, the die flag having a first surface and an opposite second surface, and lead fingers that extend inwardly from the surrounding frame towards the die flag;
    mounting the die assembly on the first surface of the die flag such that the thermally conductive substrate is sandwiched between the die flag and the semiconductor die;
    electrically connecting electrodes of the die to the lead fingers with bond wires; and
    encapsulating at least the semiconductor die, bond wires and thermally conductive substrate with a mold compound, wherein the second surface of the die flag is exposed through the mold compound,
    wherein a thickness of the thermally conductive substrate multiplied by a Coefficient of Thermal Expansion (CTE) thereof plus a thickness of the die flag multiplied by a CTE thereof is within 5% of a thickness of a region of the mold compound directly aligned above the active surface of the semiconductor die multiplied by a CTE thereof.

2. The method of claim 1, wherein the thermally conductive substrate is molded to the semiconductor die.

3. The method of claim 1, wherein the thermally conductive substrate includes thermally conductive ceramic fillers.

4. The method of claim 1, wherein the thermally conductive substrate and mold compound have a Coefficient of Thermal Expansion within 10% of each other.

5. The method of claim 1, wherein the thermally conductive substrate and mold compound have a Coefficient of Thermal Expansion within 5% of each other.

6. The method of claim 1, wherein semiconductor die is located in a mechanical stress neutral plane of the package.

7. The method of claim 6, wherein the mechanical stress neutral plane of the package is both parallel to and equidistant from the active surface and the opposite mounting surface of the semiconductor die.

8. The method of claim 1, wherein the thermally conductive substrate and a region of the mold compound directly aligned above the active surface of the semiconductor die have a thickness that is within 5% of each other.

9. The method of claim 1, wherein the die flag is attached to the surrounding frame by tie bars with and an angled section that form a down-set relationship therebetween.

10. The method of claim 1, wherein the lead fingers have an angled section relative to the surrounding frame such that free ends of the lead fingers are down-set from the surrounding frame.

11. A semiconductor die package, comprising:
a thermally conductive die flag having a first surface and an opposite second surface;
lead fingers spaced from and surrounding the die flag;
a die assembly mounted on the first surface of the die flag, the die assembly including a semiconductor die with an active surface and an opposite mounting surface, wherein the mounting surface has a substrate attached thereto and sandwiched between the die flag and the semiconductor die;
bond wires selectively electrically connecting electrodes of the die to the lead fingers; and
a mold compound encapsulating the semiconductor die, bond wires and substrate,
wherein the substrate and mold compound have a Coefficient of Thermal Expansion within 5% of each other, and the substrate and a region of the mold compound aligned directly above the active surface of the semiconductor die have a thickness that is within 5% of each other.

12. The semiconductor die package of claim 11, wherein the substrate is a compound based material molded to the semiconductor.

13. The semiconductor die package of claim 11, wherein the substrate includes thermally conductive ceramic fillers.

14. The semiconductor die package of claim 11, wherein the substrate and mold compound have a Coefficient of Thermal Expansion within 10% of each other.

15. The semiconductor die package of claim 11, wherein semiconductor die is located in a mechanical stress neutral plane of the package.

16. The semiconductor die package of claim 15, wherein the mechanical stress neutral plane is both parallel to and equidistant from the active surface and the opposite mounting surface.

17. The semiconductor die package of claim 11, wherein a thickness dimension of the substrate multiplied by a Coefficient of Thermal Expansion thereof plus a thickness dimension of the die flag multiplied by a Coefficient of Thermal Expansion thereof is within 5% of a thickness dimension of a region of the mold compound directly aligned above the active surface of the semiconductor die multiplied by a Coefficient of Thermal Expansion thereof.

* * * * *